(12) United States Patent
Cripe

(10) Patent No.: US 9,350,076 B1
(45) Date of Patent: May 24, 2016

(54) WIDEBAND VOLTAGE-DRIVEN ELECTRICALLY-SMALL LOOP ANTENNA SYSTEM AND RELATED METHOD

(71) Applicant: David W. Cripe, Mount Vernon, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 42 days.

(21) Appl. No.: 14/081,800

(22) Filed: Nov. 15, 2013

(51) Int. Cl.
| | |
|---|---|
| *H04B 1/10* | (2006.01) |
| *H01Q 5/00* | (2015.01) |
| *H04B 1/04* | (2006.01) |
| *H03H 7/40* | (2006.01) |
| *H01Q 21/00* | (2006.01) |

(52) U.S. Cl.
CPC ........... *H01Q 5/0093* (2013.01); *H04B 1/0458* (2013.01); *H04B 1/0475* (2013.01); *H01Q 21/0056* (2013.01); *H03F 2200/451* (2013.01); *H03H 7/40* (2013.01)

(58) Field of Classification Search
CPC . H03H 7/40; H03F 2200/451; H01Q 21/0056
See application file for complete search history.

(56) References Cited

U.S. PATENT DOCUMENTS

| | | | | |
|---|---|---|---|---|
| 4,115,783 | A * | 9/1978 | Reggia .......................... | 343/792 |
| 5,854,608 | A * | 12/1998 | Leisten ......................... | 343/895 |
| 6,614,403 | B1 * | 9/2003 | Merenda ....................... | 343/741 |
| 7,859,474 | B1 * | 12/2010 | Cripe et al. ................... | 343/745 |
| 2002/0180534 | A1 * | 12/2002 | Bohn et al. ................... | 330/302 |
| 2014/0159991 | A1 * | 6/2014 | Kiss et al. .................... | 343/904 |

OTHER PUBLICATIONS

Merenda, Joseph T., "Digital Wideband Small Antenna Systems", BAE Systems, Jul. 2006, 50 pages.

\* cited by examiner

*Primary Examiner* — Ross Varndell
(74) *Attorney, Agent, or Firm* — Angel N. Gerdzhikov; Donna P. Suchy; Daniel M. Barbieri

(57) ABSTRACT

An antenna system and related method are disclosed for an electrically small antenna of variable geometry capable of a harmonically pure resonant radiation pattern over a broadband coverage of frequency selection. One geometrical embodiment comprises a multiple loop antenna system is configured to radiate a switched signal via the multiple antenna elements to inhibit transmission of any of the harmonics of the signal. An additional geometrical embodiment comprises a cylindrical shell with one or more interior center conductors to overcome radiation resistance and radiate a signal pattern of desirable toroidal shape free from undesirable harmonics.

5 Claims, 5 Drawing Sheets

WIDEBAND VOLTAGE-DRIVEN ELECTRICALLY-SMALL LOOP ANTENNA SYSTEM AND RELATED METHOD

FIELD OF THE INVENTION

The present invention relates generally to signal transmission and associated antenna structure. More particularly, embodiments of the present invention relate to an antenna system and method providing wideband transmission capability via an electrically small antenna structure.

BACKGROUND OF THE INVENTION

Traditional electrically-small antennas (ESA) may enable a broad-band operation from non-resonant loop antennas. Some efforts may employ voltage-mode Class-D power amplifiers (PA) using Radio Frequency Pulse Width Modulation (RF-PWM) to synthesize low-harmonic loop current.

While an improvement over traditional use of Class-AB PA to perform this task, the efficiency of these schemes may be quite low, not exceeding the ratio of the radiation resistance of the loop to twice the resistance (Rds) on of the switching devices. The switching losses of this scheme are expected to further degrade system efficiency.

One such traditional attempt may be described in U.S. Pat. No. 6,614,403B1 to Merenda. Because of the high voltage necessary to generate antenna current against the loop inductance, Merenda proposes placing numerous switch modules in series to sum the breakdown voltage of individual switching devices.

The concept of the Digital Wideband Small Antenna System, devised by Merenda, is to utilize a non-resonant, electrically small loop antenna as a wideband antenna. By driving it with a pulse-width-modulated switched-voltage signal, one may attempt to synthesize current waveforms within the loop to permit wideband operation.

However, the concept requires low-loss, fast switching RF power devices, to take full advantage of the approach. The losses resulting from finite switching device ON resistance attempting to supply power into vanishingly small loop radiation resistances, combined with the Digital Signal Processor (DSP) power needed to generate the RF-PWM signals severely limit the efficiency of the concept.

Additional attempts to overcome these shortfalls may offer a method of operating an electrically small antenna in a broadband manner by driving a magnetic dipole loop structure with a stepped voltage to synthesize a current waveform. While it is possible to operate an electrically small magnetic dipole antenna over multiple octaves of bandwidth, the radiated pattern is irregular, comprised of both horizontal and vertical components due to the voltage driving the feed point of the loop. In addition, the power required to overcome the inductive reactance of the loop feed point and sufficiently resonate the loop may require multiple power amplifiers to create sufficient power into the loop antenna to force radiation.

A switching power amplifier enabling waveform synthesis may be best described in U.S. Pat. No. 4,894,621 which is incorporated by reference in its entirety. This PA enables a third and fifth harmonic cancellation through voltage level manipulation in a switching power amplifier. This technique, while applicable for cancellation of signal harmonics, requires a complicated power amplifier configuration.

However, a loop antenna, as described by the previous references, when driven by a voltage source at a feed point along its circumference will possess a non-uniform directional radiation pattern over frequency, affecting the ability to cancel harmonic radiation from the harmonically-rich switched voltage source.

These attempts fail to address that effectiveness of the loop antenna increases with frequency up to the resonant frequency of the loop or a harmonic of the resonant frequency of the loop. The square wave output of a class-D PA may contain all odd harmonics in relatively high amplitude. To simply apply a class-D PA to an ESA one may struggle to force radiation at the desired frequency below resonance while those harmonics which fall near the frequencies of resonance of the loop will be radiated at a significantly higher amplitude. Therefore, such a system may not meet a nominal harmonic radiation specification (e.g. −80 dBc).

Consequently, a need remains for a wideband voltage driven electrically small antenna able to overcome the harmonic limitations and additional shortfalls of the prior art systems.

SUMMARY OF THE INVENTION

Accordingly, an embodiment of the present invention is directed to an electrically small antenna system for radiation of a desired transmission signal, comprising: a plurality of loop antenna elements oriented planarly perpendicular with and tangentially to a ground plane, each of the plurality of loop antenna elements axially separated from another of the plurality of loop antenna elements by a distance of much smaller than the electrical wavelength of the frequency of operations, specifically, approximately one tenth of a diameter of one of the plurality of loop antenna elements; a plurality of power amplified signals amplified via a corresponding plurality of power amplifiers, each one of the plurality of power amplified signals configured for one of the plurality of loop antenna elements, the power amplified signals a fraction of a desired antenna system output power at a desired frequency, the plurality of power amplified signals coupled to a corresponding one of the plurality of loop antenna elements at a first connection point, the first connection point a location where the corresponding one of the plurality of loop antenna elements meets the ground plane; the ground plane coupled to an opposite connection point on the corresponding one of the plurality of loop antenna elements at a second connection point, the second connection point a second location where the corresponding one of the plurality of loop antenna elements meets the ground plane; wherein the electrically small antenna system is configured for: receiving the desired transmission signal, the desired transmission signal having a frequency and a plurality of related harmonics of the frequency; splitting a desired output power of the desired transmission signal into a number of fractional transmission signals, the number of fractional transmission signals corresponding to a number of loop antenna elements of the plurality of loop antenna elements, the splitting configured for harmonic cancellation of at least one target harmonic of the plurality of related harmonics of the frequency; staggering a switching point of each of the corresponding power amplifiers in time; amplifying the fractional transmission signals to generate the plurality of power amplified signals; transmitting the plurality of power amplified signals to each one of the corresponding loop antenna elements; radiating the desired transmission signal via the plurality of loop antenna elements, the radiating configured to inhibit radiation of the at least one target harmonic.

An additional embodiment of the present invention is directed to an electrically small antenna system for transmission of a desired transmission signal wherein the plurality of loop antenna elements share a common axis parallel to the ground plane and each one of the plurality of power amplified signals configured for one of the plurality of loop antenna elements is further configured for a specific one of plurality of loop antenna elements based on the physical location of the specific one of plurality of loop antenna elements.

An additional embodiment of the present invention is directed to an electrically small antenna system wherein the desired transmission signal is generated via a voltage-sourced Class-D half-bridge comprised of photoconductive semiconductor switches, the photoconductive semiconductor switches providing an inherent isolation between a driver circuitry and a power source and at least one of the fractional transmission signals is independent from another of the fractional transmission signals.

An additional embodiment of the present invention is directed to an electrically small antenna system wherein splitting the desired output power of the desired transmission signal into a number of fractional transmission signals creates individual fractional transmission signals configured for minimal interaction with another of the fractional transmission signals and inhibiting radiation of the at least one target harmonic is based on a phase shift of the fractional transmission signals.

An additional embodiment of the present invention is directed to an electrically small antenna system for radiation of a desired transmission signal, comprising: a conductive cylindrical shell having a circumference and a height, the height aligned along an axis orthogonal to a ground plane; a power amplifier configured for amplifying a desired transmission signal; an interior center conductor aligned with the axis orthogonal to the ground plane and centered within the circumference, the interior center conductor terminated at a cap of the conductive cylindrical shell, the cap a distance distal from the ground plane equal to the height; wherein the electrically small antenna system is configured for: receiving the desired transmission signal, the desired transmission signal having a frequency; transmitting the desired transmission signal to the conductive cylindrical shell via the interior center conductor; and radiating the desired transmission signal via the conductive cylindrical shell, the radiating configured to radiate an azimuthally regular radiation pattern, the radiating further configured to present a nominally inductive feed point impedance required of the power amplifier.

An additional embodiment of the present invention is directed to an electrically small antenna system wherein a plurality of power amplifiers are combined through a corresponding plurality of independent interior center conductors within the conductive cylindrical shell, the independent interior center conductors configured to inhibit transmission of at least one harmonic of the frequency.

An additional embodiment of the present invention is directed to an electrically small antenna system wherein transmitting the desired transmission signal to the conductive cylindrical shell further comprises transmitting a voltage from the power amplifier via the interior center conductor to the cap of the cylinder, the voltage configured to induce an RF current to flow axially from the ground plane over the conductive cylindrical shell to radiate the desired transmission signal.

An additional embodiment of the present invention is directed to an electrically small antenna system wherein the nominally inductive feed point impedance is substantially inductive in at least one frequency below resonance and radiating the desired transmission signal via the conductive cylindrical shell further comprises radiating the desired transmission signal in a non-resonant mode over multiple octaves of the frequency with no tuning required.

An additional embodiment of the present invention is directed to an electrically small antenna system wherein the power amplifier is a high-voltage class-D power amplifier used as a basis for a switched voltage.

An additional embodiment of the present invention is directed to a method for radio frequency radiation of a desired transmission signal, comprising: means for receiving the desired transmission signal, the desired transmission signal having a frequency; means for amplifying the desired transmission signal; means for transmitting the desired transmission signal to a radiating means; means for radiating the desired transmission signal, the radiating means configured to radiate an azimuthally regular radiation pattern, the radiating means further configured to present a desired nominally inductive feed point impedance; means for inhibiting radiation of a target harmonic of the frequency; and means for generating a uniform, azimuthally regular radiation pattern.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Embodiments of the present invention are directed to a system and related method for an electrically small loop antenna of variable geometry capable of a harmonically pure resonant radiation pattern over a broadband coverage of frequency selection.

Embodiments of the present invention additionally permit creation of broadband, electrically small radiators with efficiency previously unattainable through traditional methods. The invention may be utilized in multi-radiator systems and arrays. Because of the potential for broadband operation, the invention may be used to replace multiple antenna systems.

Loop Antenna

Figure 1:
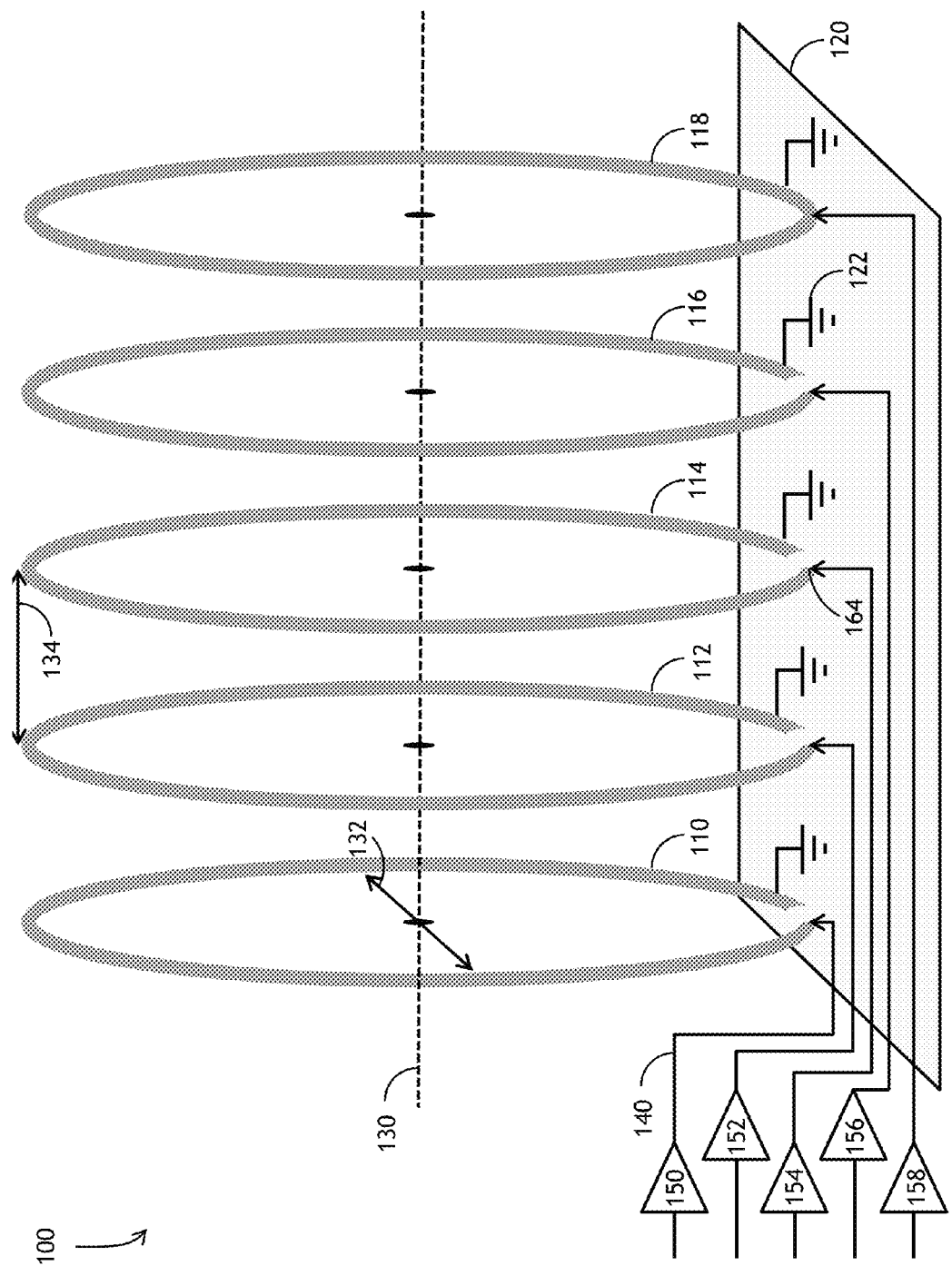
FIG. 1 is a diagram of a small diameter loop antenna illustrative of an embodiment of the present invention.

Referring to FIG. 1, a diagram of a small diameter loop antenna illustrative of an embodiment of the present invention is shown. System 100 may comprise a loop antenna with a common axis 130, the common axis 130 parallel to a ground plane 120. The loop antenna is subdivided into n individual loop antennas 110, 112, 114, 116 and 118 (representing n loops) of equal diameter, each separated by an axial separation 134 smaller than an electrical wavelength of a frequency of operation of the plurality of loop antenna elements. In one embodiment, axial separation 134 is approximately 0.05 to 0.5 of the diameter 132 of each loop antenna element.

Embodiments of the present invention are directed to an antenna structure comprised of numerous small loops 110-118 in parallel. Each loop may be independently driven by its own class-D PA 150-158. Isolation between loops may be realized due to the imperfect magnetic coupling between each loop. Consequently, system 100 may drive each loop of the system individually via a separate class-D PA per loop and realize minimal interaction between each successive loop.

Because of the axial separation 134 of each loop, system 100 maintains a degree of isolation between each loop 110. For example, two loops separated by 0.1 diameter 132 may have a coupling factor of 0.25. The superimposition of the magnetic fields of each loop may allow the drive signal 140 to each loop to be independent with minimal interaction. Each loop may share a signal at the desired frequency of operation that is nominally equal between each loop. However, drive signals each are constructive in such a way that the harmonic signals of each loop sum to zero.

System 100 maintains sufficient mutual coupling between each of the loops leading the effective radiation resistance may increase as compared to a single loop. In addition, as efficiency of system 100 may be defined as the ratio of the radiation resistance of the loop to the sum of the channel resistance of the switching transistors plus that of the radiation resistance, system 100 may realize a greater efficiency over that found in traditional systems. Here, the radiation resistance may rapidly diminish to zero because of the limiting factor as the goal is to use transistors with very low on-resistance so that the circulating current through the loop and through the transistors applies most of the power to the radiation rather than to the ohmic heating of the transistors.

Alternatively, system 100 may alter the power to each loop and provide extendable interaction between each loop. System 100 may drive each PA 150 with a separate signal such that each PA 150 provides a fraction of the overall output power at the desired frequency of operation. Moreover, the harmonic content of each PA 150 is at a different phase angle such that the summation of the harmonic signals may cancel. System 100 may employ this as a means for cancelling the harmonic radiation of the system in a way that prevents those signals from being radiated.

Retaining a portion of the traditional aspects of construction enabling an electrically small loop to create a magnetic diploe parallel to the ground plane, system 100 may create an orthogonal electrical field dipole in a toroidal shape surrounding the antenna.

Preferably, each loop 150 is driven by a voltage-sourced Class-D half-bridge comprised of switching devices. Photoconductive semiconductor switches (PCSS) are preferred, as they possess high withstand voltage, low capacitance, and the laser drive signals provide inherent isolation between the driver circuitry and the power switches. Radiation resistance of each sub-loop is increased proportionately by the number of loops 150.

System 100 drives each half-bridge switch pair using a preferred pair of complimentary pulses each with duty slightly less than 50%. There may be a phase shift in the drive between half-bridges on each loop. System 100 may further use this outphasing to control the amplitude of current in each loop 150.

System 100 operates the drive signals of each independent loop 150 to be phase shifted in a manner that permits cancellation of harmonics of the transmitted signal.

System 100 may additionally operate with broadband frequency agility. To overcome variable radiation resistance of the loop 150 with the negative fourth power of frequency, system 100 may vary the amplitude of the loop excitation voltage inversely with frequency. As the impedance of the loop inductance also varies inversely with frequency, system 100 varies the loop current inversely with frequency squared. System 100 maintains the capability of the drive circuit to vary the amplitude of excitation voltage through outphasing of the H-bridge.

Multiple loop radiators may then be combined to create ESAs, conformal arrays, directional arrays, circularly polarized systems, and the like.

Preferably, at a feed point 164 where each loop 110 circumference intersects the ground plane 120, each loop is individually fed by a class-D PA 150, 152, 154, 156 and 158 (representing n PAs) having a push pull single-ended output. The opposite end of each loop antenna element 110-118, may be grounded 122 to the ground plane 120. Each PA 150-158 may have its own unique output waveform. Preferably, the format of the unique waveform is varied so each loop 150 contributes to the output power of the desired frequency of operation and has a variance of the phase of the harmonic of the desired frequency.

System 100 may obtain this phase variance by staggering the switching points of each of the class-D PA 150-158 in time. The timing of the stagger is dependent on a fraction of the RF cycle in such a way that system 100 may obtain harmonic cancellation. For example, if two square waves are superimposed and angularly separated by 120 degrees in time over the RF cycle of 360 degrees, an effective cancellation of the third harmonic may be realized. Further, taking two of these signals superimposed and angularly separated by 72 degrees, a cancellation of the fifth harmonic may be realized. This system 100 harmonic may be carried forward ad infinitum effectively cancelling any desired harmonic limited by a number of available class-D PA supply.

Square Evolution

Figure 2:
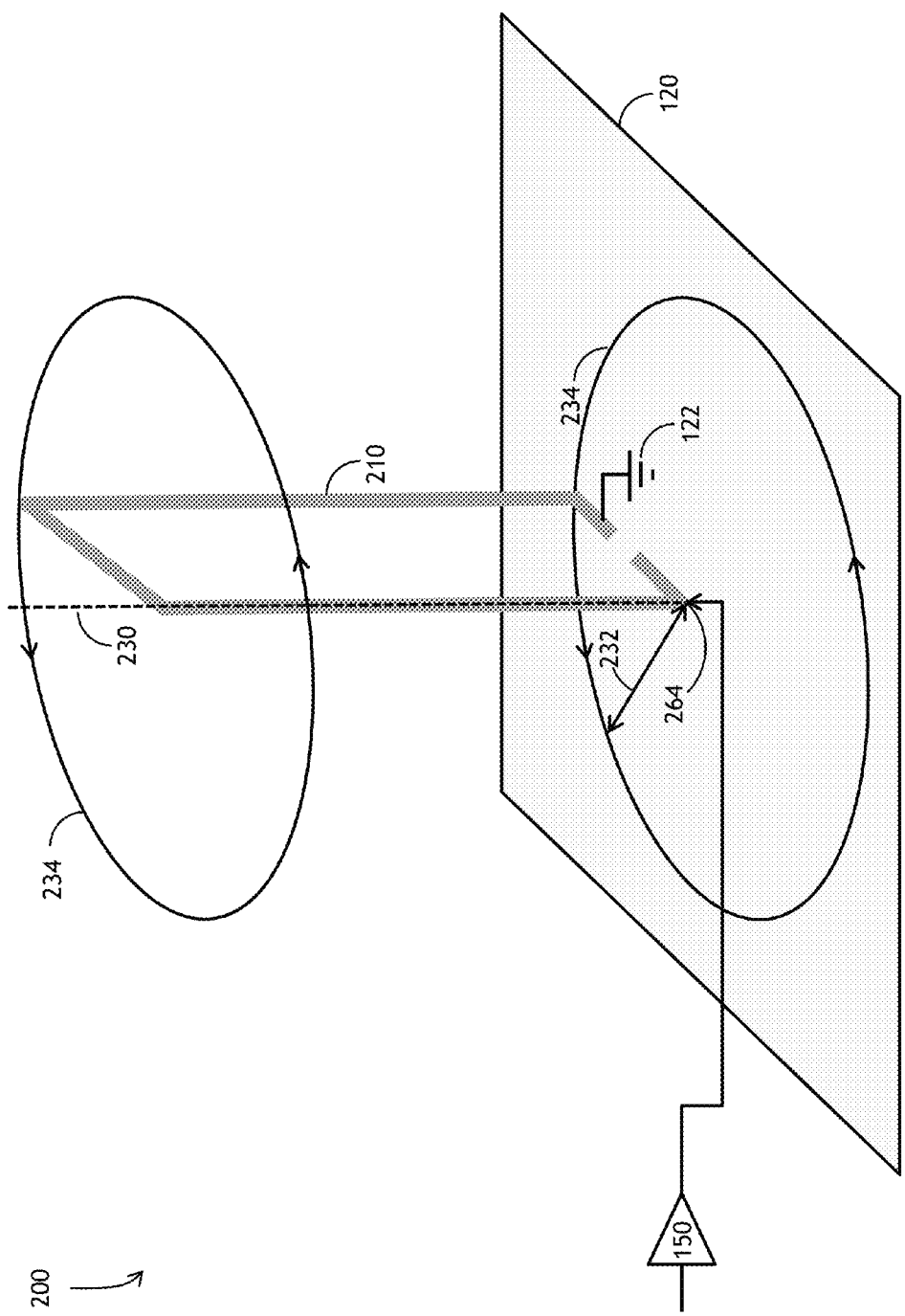
FIG. 2 is a diagram of a small diameter square loop antenna illustrative of an embodiment of the present invention.

Referring to FIG. 2, a diagram of a small diameter square loop antenna illustrative of an embodiment of the present invention is shown. Preferably, one embodiment of the present invention may include a square loop antenna 210 configured orthogonally to the ground plane 120. The single loop antenna modified in a square 210 has an electrical feed point 264 where one of the corners of the square meets the ground plane and the adjacent corner also meeting the ground plane along radius 232 being grounded 122. With the plane of the square loop orthogonal to the ground plane 120, the square loop antenna may operate in a similar manner to the circular loop of FIG. 1.

The square loop antenna 210 may be further configured in a plurality of square loops in a circular pattern aligned at the edge of each square loop meeting the normal axis 230 with each of the grounded adjacent corners of the square loops 210 forming a circle 234 overlain on the ground plane 120. Each of the plurality of square loops 210 may be configured around the normal axis 230 and aligned circularly around the normal axis 230 passing through the electrical feed point resulting in a shape similar to a cylinder. The resulting cylinder may be electrically fed through the center conductor while the external shell of the cylinder is grounded 122 to the ground plane 120.

Cylindrical Antenna

Figure 3:
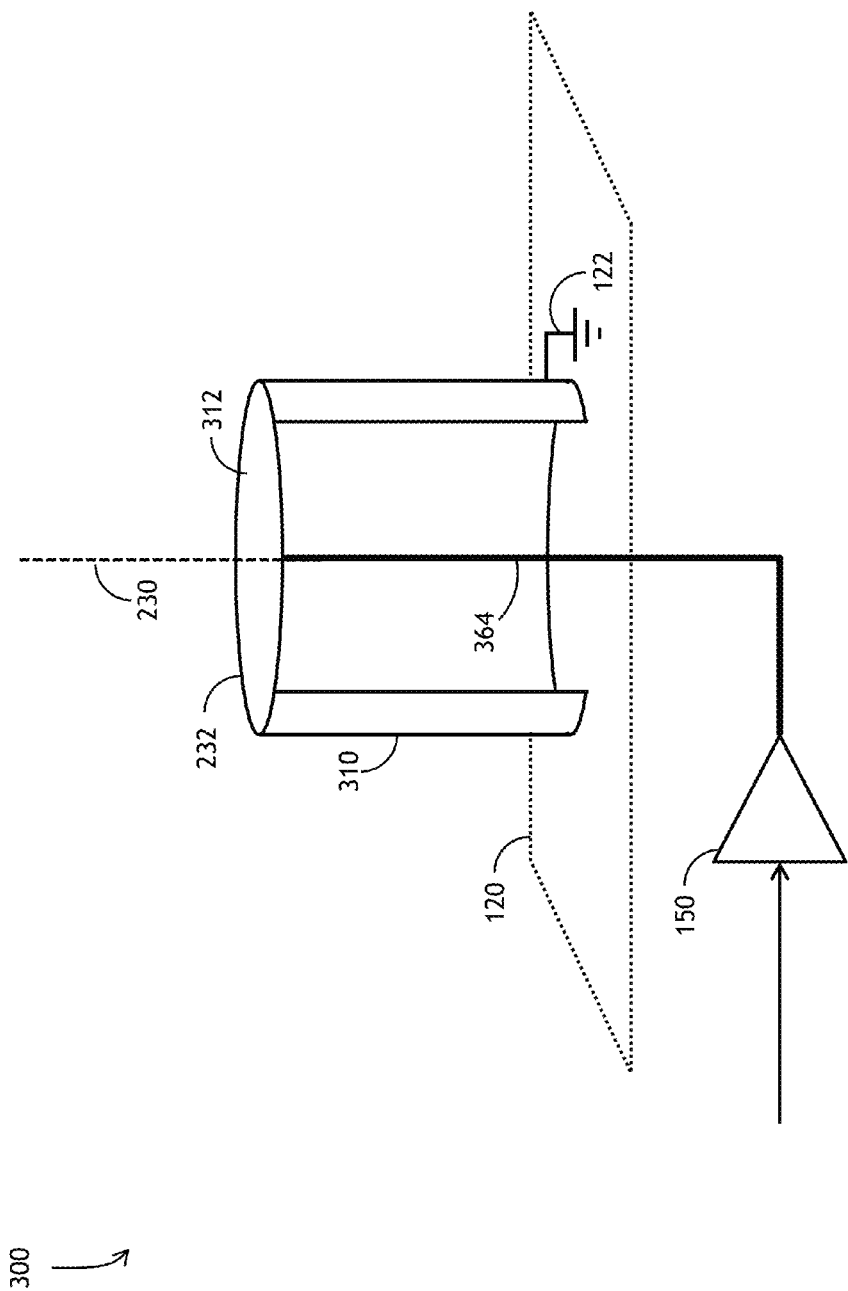
FIG. 3 is a diagram of a small diameter cylindrical antenna illustrative of an embodiment of the present invention.

Referring to FIG. 3, a diagram of a small diameter cylindrical antenna illustrative of an embodiment of the present invention is shown. System 300 may comprise antenna construction that generates a uniform, azimuthally regular radiation pattern, while presenting the nominally inductive feed point impedance required of the power amplifier for efficient operation.

This technology permits fabrication of low-profile transmitting antennas for airborne applications, and dispenses with the necessity for coupler networks. Because system 300 operates the antenna in a non-resonant mode, it is not bound by a lower limit on the Quality (Q) factor for small radio antennas, and can be operated over multiple octaves of frequency with no tuning required.

System 300 may include an antenna comprised of a conductive cylindrical shell 310, mounted orthogonally to the ground plane 120. The cylindrical shell 310 maintains a circumference 232 and is aligned with the normal axis 230 to ground plane 120. The antenna is driven by the power amplifier 150 via a concentric, coaxial conductor 364, terminated at the cap of the cylinder 312.

Voltage from the power amplifier 150 is conveyed via the interior center conductor 364 to the cap 312 of the cylinder. This voltage induces RF current to flow axially from the ground plane 120 over the outer surface of the cylinder 310, thus radiating RF power. The feed point 164 impedance of system 300 antenna is substantially inductive at frequencies below resonance, where the antenna is electrically small.

Multi-Feed Path

Figure 4:
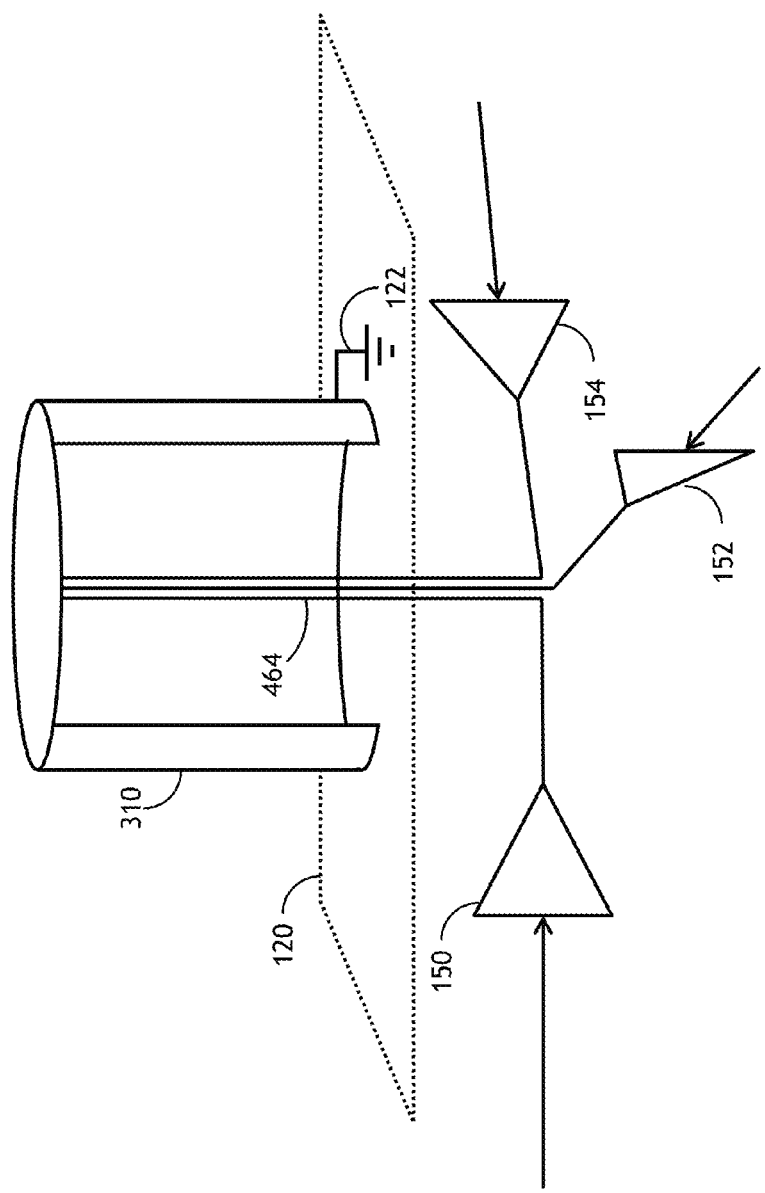
FIG. 4 is a diagram of a multi-feed path small diameter cylindrical antenna illustrative of an embodiment of the present invention.

Referring to FIG. 4, a diagram of a multi-feed path small diameter cylindrical antenna illustrative of an embodiment of the present invention is shown. Multiple power amplifiers 150-154 may be combined through multiple, parallel conductors 464 within the cylinder 310.

By utilizing a high-voltage Class-D power amplifier 150 as the basis of the switched voltage, systems 100-400 may transmit an RF signal efficiently despite the poor radiation resistance of the loop antenna.

Systems herein may apply a class-D PA as a single ended device in a manner analogous to a Digital to Analog Converter (DAC) or Power DAC. The present invention may cascade a system of power amplifiers where each successive section has an amplitude one-half that of its predecessor to create a harmonically pure sine wave of desired resolution based in part on the number of stages of power amplifiers used in implementation.

Embodiments of the present invention may generate the signal in such a way as to equalize the transmission power over the harmonics of signal. Enabling a single ended PA system with an antenna modified to operate in a single ended manner.

Systems 100-400 may preferably radiate an omnidirectional signal that is vertically polarized. The loop antenna excited via such a harmonically rich source, may tend to have a pattern of radiation in a figure eight pattern parallel to the ground plane above which the antenna may radiate. The pattern may increase in complexity dependent on frequency.

The present invention may employ a modified loop antenna coaxially fed electrically small monopole. System 400 may preferably route the center conductor 464 (e.g., a coax) where the center conductor outer conductor is connected to the ground plane 120 while the upper terminus is tied to the outer shield 310. Thus the voltage applied to the center conductor enables a voltage excitation of the outer shell thus allowing the antenna to radiate in an azimuthally symmetrical pattern.

Further, system 400 may apply this structure as its own combiner. System 400 may combine multiple amplifiers through numerous parallel center conductors with some nominal spatial separation providing a degree of electrical isolation from one another. In this orientation, system 400 may attain harmonic cancellation or attain higher digital effective operational performance by summing in separate additional power DAC outputs.

Despite the fact that we can apply separate excitation voltages to the plurality of center conductors, the outer shield structure of the antenna structure provides shielding so that system 400 is able to maintain a azimuthally symmetrical pattern both in the intended signal of radiation as well as any harmonics generated from the additional separate power amplifiers.

One application of system 100 may include a directional array of multiple radiators to create a desired directional pattern by summing the outputs of the multiple radiators.

Flow

Figure 5:
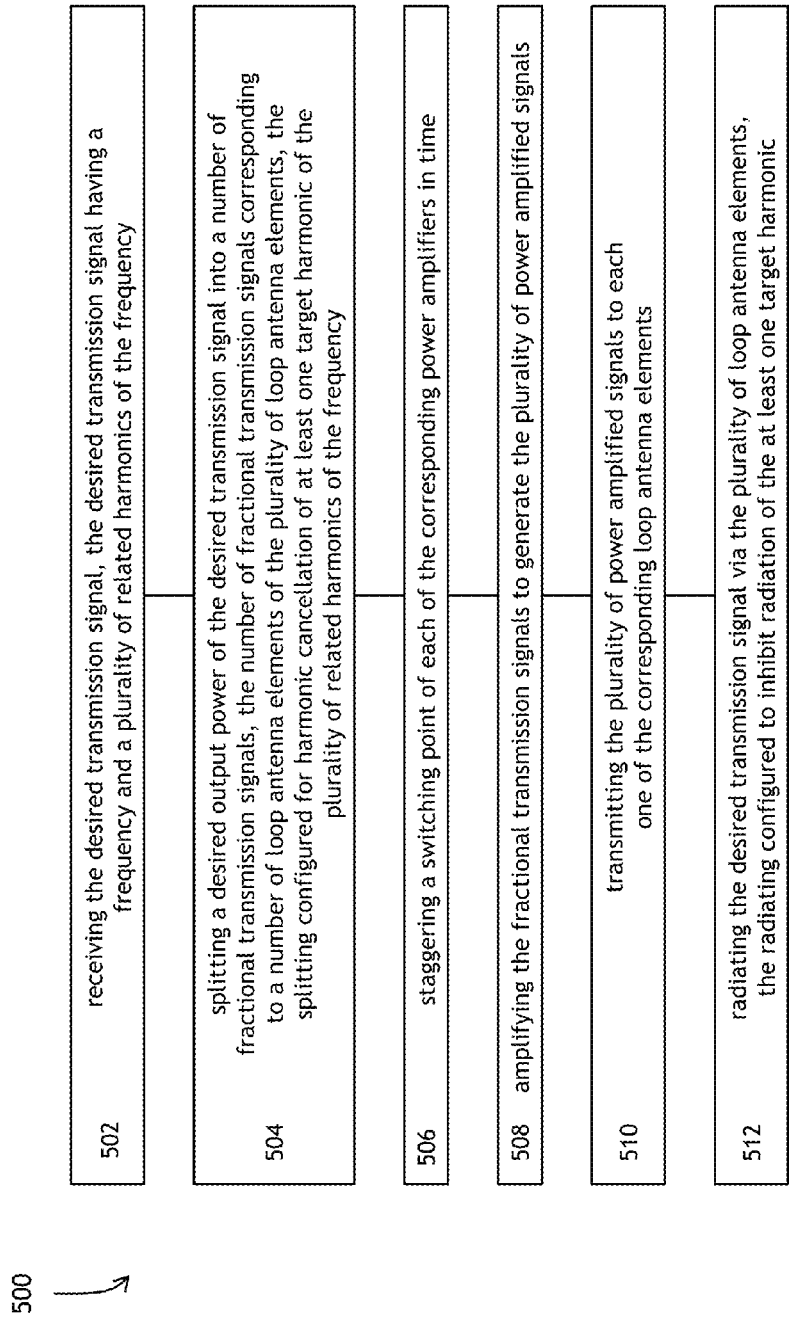
FIG. 5 is a flow diagram of a method for transmission of a signal exemplary of an embodiment of the present invention.

Referring to FIG. 5, a flow diagram of a method for transmission of a signal exemplary of an embodiment of the present invention is shown. Method 500 may begin at step 502, with receiving the desired transmission signal, the desired transmission signal having a frequency and a plurality of related harmonics of the frequency; and at step 504, splitting a desired output power of the desired transmission signal into a number of fractional transmission signals, the number of fractional transmission signals corresponding to a number of loop antenna elements of the plurality of loop antenna elements, the splitting configured for harmonic cancellation of at least one target harmonic of the plurality of related harmonics of the frequency; and at step 506, staggering a switching point of each of the corresponding power amplifiers in time; and at step 508, amplifying the fractional transmission signals to generate the plurality of power amplified signals; and at step 510, transmitting the plurality of power amplified signals to each one of the corresponding loop antenna elements; and at step 512, radiating the desired transmission signal via the plurality of loop antenna elements, the radiating configured to inhibit radiation of the at least one target harmonic.

CONCLUSION

Specific blocks, sections, devices, functions, processes and modules may have been set forth. However, a skilled technologist will realize that there are many ways to partition the system, and that there are many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled//implemented/translated/converted into a high-level descriptor language (e.g., initially implementing described technologies in C or C++ programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electromagnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is shown/described herein as a single illustrated figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. An electrically small antenna system for radiation of a desired transmission signal, comprising:
    a conductive cylindrical shell having a circumference and a height;
    a ground plane electrically connected with the conductive cylindrical shell, the height of the conductive cylindrical shell aligned along an axis orthogonal to the ground plane;
    a cap of the conductive cylindrical shell coupled with the conductive cylindrical shell, the cap a distance distal from the ground plane equal to the height;
    a plurality of power amplifiers combined through a corresponding plurality of independent interior center conductors, the plurality of independent interior center conductors configured to inhibit transmission of at least one harmonic of a frequency of the desired transmission signal, each independent interior center conductor aligned with the axis orthogonal to the ground plane and centered within the circumference, each independent interior center conductor terminated at the cap;
    wherein the electrically small antenna system is configured for:
    receiving the desired transmission signal;
    transmitting the desired transmission signal through the conductive cylindrical shell to the ground plane via the plurality of independent interior center conductors and the cap;
    inhibiting radiation of a target harmonic of the frequency; and
    radiating the desired transmission signal via the conductive cylindrical shell, the radiating configured to radiate an azimuthally regular radiation pattern, the radiating further configured to present a desired inductive feed point impedance required of a power amplifier of the plurality of power amplifiers.

2. The electrically small antenna system for radiation of the desired transmission signal of claim 1, wherein transmitting the desired transmission signal through the conductive cylindrical shell further comprises transmitting a voltage from the power amplifier of the plurality of power amplifiers via an independent interior center conductor of the plurality of independent interior center conductors to the cap, the voltage configured to induce an RF current to flow axially from the ground plane over the conductive cylindrical shell to radiate the desired transmission signal.

3. The electrically small antenna system for radiation of the desired transmission signal of claim 1, wherein the desired inductive feed point impedance is inductive in at least one frequency below resonance.

4. The electrically small antenna system for radiation of the desired transmission signal of claim 1, wherein radiating the desired transmission signal via the conductive cylindrical shell further comprises radiating the desired transmission signal in a non-resonant mode over multiple octaves of the frequency with no tuning required.

5. The electrically small antenna system for radiation of the desired transmission signal of claim 1, wherein the power amplifier of the plurality of power amplifiers is a high-voltage class-D power amplifier used as a basis for a switched voltage.

* * * * *